United States Patent [19]

Soyano et al.

[11] Patent Number: 5,691,884

[45] Date of Patent: Nov. 25, 1997

[54] SEMICONDUCTOR DEVICE WITH REMOVABLY FIXED LEAD FRAME

[75] Inventors: Shin Soyano; Susumu Toba, both of Nagano, Japan

[73] Assignee: Fuji Electric Co., Ltd., Kawasaki, Japan

[21] Appl. No.: 566,957

[22] Filed: Dec. 4, 1995

[30] Foreign Application Priority Data

Dec. 8, 1994 [JP] Japan ................................ 6-304722

[51] Int. Cl.⁶ .................................................. H05K 7/20
[52] U.S. Cl. ........................... 361/707; 257/787; 361/752; 361/813; 439/400
[58] Field of Search .......................... 174/52.2, 52.4, 174/138 G, 138 E; 257/666, 675, 687, 690, 701, 706, 712, 713, 787, 796; 165/80.3, 185; 361/736, 752, 704, 705, 707, 717–719, 772, 774, 813; 439/377, 389, 393, 395, 400, 417

[56] References Cited

U.S. PATENT DOCUMENTS

| | | | |
|---|---|---|---|
| 4,180,305 | 12/1979 | Ustin | 339/198 H |
| 4,808,122 | 2/1989 | Tomizu | 439/417 |
| 5,546,280 | 8/1996 | Hasebe | 361/752 |

*Primary Examiner*—Gerald P. Tolin
*Attorney, Agent, or Firm*—Kanesaka & Takeuchi

[57] ABSTRACT

A semiconductor device of the invention is formed of an insulative case frame with a frame portion having elongated coupling holes, a radiator base plate covering a first opening of the insulative case frame, a circuit board with semiconductor chips bonded to the radiator base plate, a resin sealant filled in an inner space of the case frame for covering the circuit board, an insulative cover plate closing a second opening of the insulative case frame, and at least one lead frame having elastic coupling protrusions and inner leads. The elastic coupling protrusions are elastically retained in the elongated coupling holes to securely connect the lead frame to the case frame.

5 Claims, 7 Drawing Sheets

SEMICONDUCTOR DEVICE WITH REMOVABLY FIXED LEAD FRAME

DETAILED DESCRIPTION OF THE INVENTION

The present invention relates to a semiconductor device called "power module", which retains in an insulative case frame a circuit board with semiconductor elements mounted thereon, and more specifically the present invention relates to a structure for installing a lead frame.

FIG. 9 is a cross sectional view showing a general structure of a semiconductor device called "power module" or "intelligent power module". As shown in FIG. 9, the semiconductor device has an insulative case frame 10 that has a frame portion 12. A radiator base plate or metal plate 20 is bonded with an adhesive to a first opening step 14 formed on a first side of the frame portion 12 to close the first opening of the case frame 10. A circuit board or ceramic board 30 is bonded with a solder and so on to the inside face of the radiator base plate 20. Lead frames 40 through 43 are connected at inner lead ends A thereof to a thick film wiring formed on the circuit board 30. The circuit board 30 and the inner leads of the lead frames 40 through 43 are covered or immersed in a gel resin sealant or silicone resin 50. An insulative cover plate 60 is bonded with an adhesive to a second opening step 18 formed on a second side of the frame portion 12 opposite to the first side to close the second opening of the case frame 10.

Semiconductor elements or chips 32, 34 such as power transistors, IGBTs (conductivity-modulation-type transistors), diodes, thyristors, and so on are mounted on the circuit board 30. The inner lead ends A of the lead frames 40 through 43 are bonded with a solder and etc. to the thick film wiring or land portion thereof of the circuit board 30, and connected through bonding wires 32a, 34a to the corresponding semiconductor elements 32, 34. The lead frames 40, 41 for external connection are formed with the frame portion 12 by an insert molding, and fixed to the frame portion 12 at respective terminal washers 40a, 41a to be connected to terminal screws (not shown) for external connection.

FIG. 10 is a cross sectional view for showing the installation of the lead frame of the semiconductor device of FIG. 9. As shown in FIG. 8, the lead frames 42, 43 for connecting a plurality of electrodes mutually on the circuit board for internal power supply are installed such that coupling protrusions B are pressed into long coupling holes C formed on a third step 16 of the resin frame portion 12. Teeth b are formed on the side face of the coupling protrusion B, which encroaches upon the wall of the coupling hole C to anchor the coupling protrusion B.

The structure of the lead frames 42, 43 for internal connection in the above described semiconductor device has following drawbacks.

The coupling protrusion B is designed such that when the coupling protrusion B is pressed into the slit-shaped coupling hole C of the resin frame portion 12, the coupling protrusion B may encroach upon the wall of the coupling hole C and may not come out from the coupling hole C. It is necessary to set the width W1, e.g. several mm, of the coupling protrusion B wider than the length W2 of the coupling hole C. If the width W1 of the coupling protrusion B is too wide, it will be difficult to press the coupling protrusion B into the coupling hole C. Therefore, the width W1 of the coupling protrusion B and the length W2 of the coupling hole C should be controlled strictly. Since the coupling hole C is formed by resin molding, there is a deviation in the length W2 of the coupling hole C by the sink etc. of the resin. The deviation of the length W2 makes it difficult to press the coupling protrusion B into the coupling hole C or rattle the coupling protrusion B in the coupling hole C. Thus, the deviation of the length W2 is hazardous for improving the production yield of the semiconductor devices.

In view of the foregoing, it is an object of the invention to provide a semiconductor device that has a highly reliable installation structure for the lead frame, and the coupling protrusions thereof do not rattle in the coupling holes of the insulative case frame even if the dimension of the long coupling holes is roughly controlled.

SUMMARY OF THE INVENTION

According to an aspect of the present invention, there is provided a semiconductor device, which comprises: a lead frame having coupling protrusions and inner leads, the coupling protrusions being twisted in the opposite directions from one another; an insulative case frame including a frame portion with a step, on which are formed long or elongated coupling holes into which the coupling protrusions are inserted; a radiator base plate covering a first opening of the insulative case frame; a circuit board on which are mounted semiconductor chips connected to the ends of the inner leads, the circuit board being bonded to the inner face of the radiator base plate; a gel resin sealant filling an inner space of the insulative case frame for covering the circuit board and the inner leads; and an insulative cover plate closing a second opening of the insulative case frame opposite to the first opening. It is preferable to widen a head of the coupling protrusion in an elliptical shape.

According to another aspect of the invention, the coupling protrusions may be formed in a V-shape in the longitudinal cross section thereof.

Since the adjacent coupling protrusions are elastically twisted or bent in the opposite directions from one another, when the coupling protrusions are inserted into the long coupling holes of the case frame, in the early stage of inserting the coupling protrusions, heads of the coupling protrusions are twisted or bent in the directions to reduce or eliminate the torsion angle. After the coupling protrusions are completely pressed into the long coupling holes, the coupling protrusions return or expand to be tightly coupled with the elongated coupling holes by the elastic force of the restoring torsion. Thus, the coupling protrusions pressed into the long coupling holes do not rattle in the long coupling holes.

Since the head is elliptical, the coupling protrusion can be smoothly inserted into the long coupling hole. It is facilitated to press the coupling protrusion into the long coupling holes.

In the invention, the coupling holes may be inclined relative to the coupling protrusions. Also, the coupling protrusion may be bent in a V-shape. When the V-shaped coupling protrusions are inserted into the holes, the V-shape of the protrusion widens or opens during the insertion into the coupling hole. After the coupling protrusion is completely inserted into the coupling hole, the coupling protrusion is bent back to expand in the coupling hole by the elastic restoring force which decreases the angle of V-shape. In this structure too, the lead frame is tightly mounted on the semiconductor device without rattling.

DETAILED DESCRIPTION OF PREFERRED EMBODIMENTS

Now the present invention will be explained hereinafter with reference to the accompanied drawings which illustrate the preferred embodiments of the invention.

Figure 1:
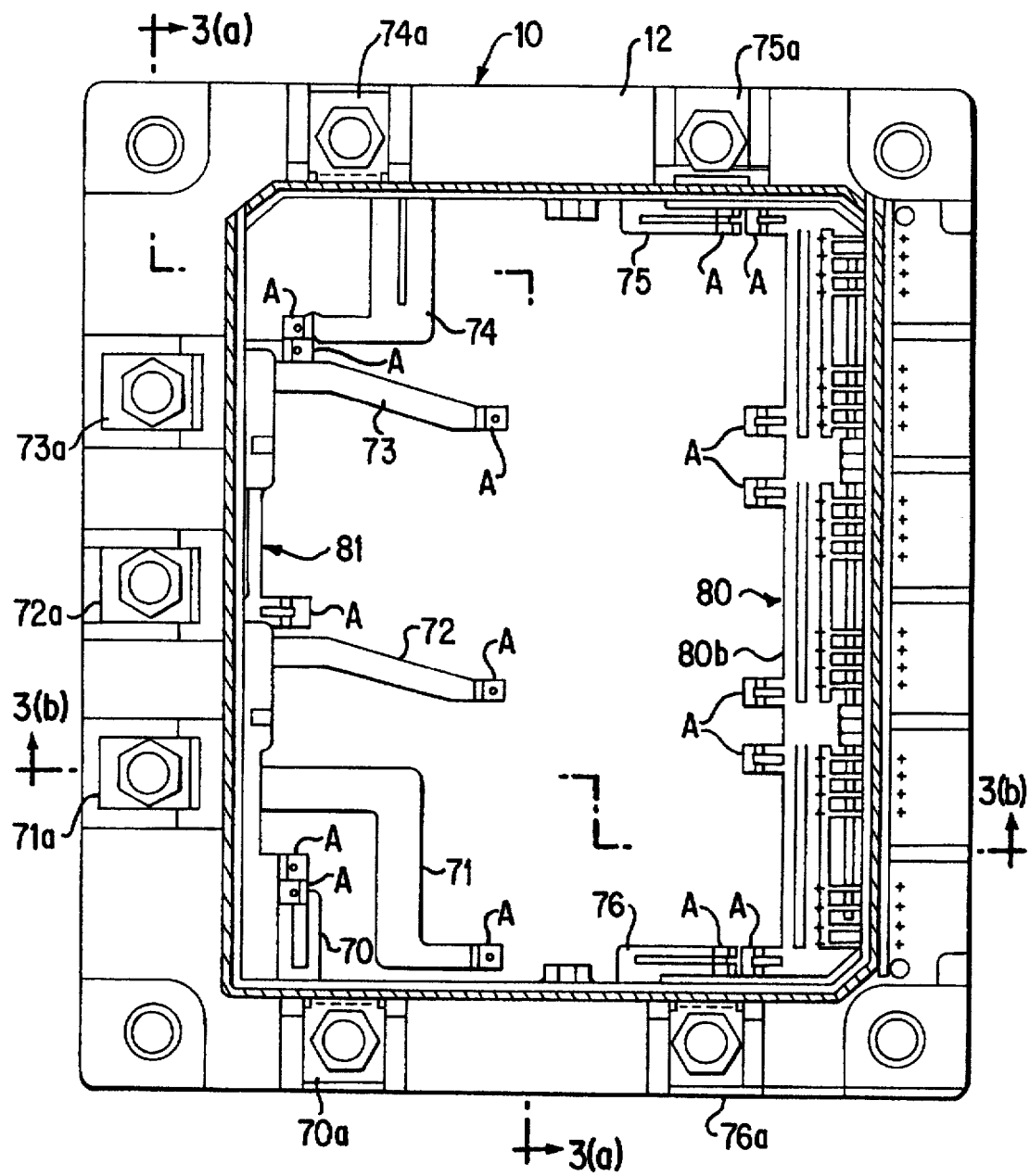
FIG. 1 is a top plan view for showing an insulative case frame having lead frames of an embodiment of a semiconductor device according to the present invention.
Figure 2:
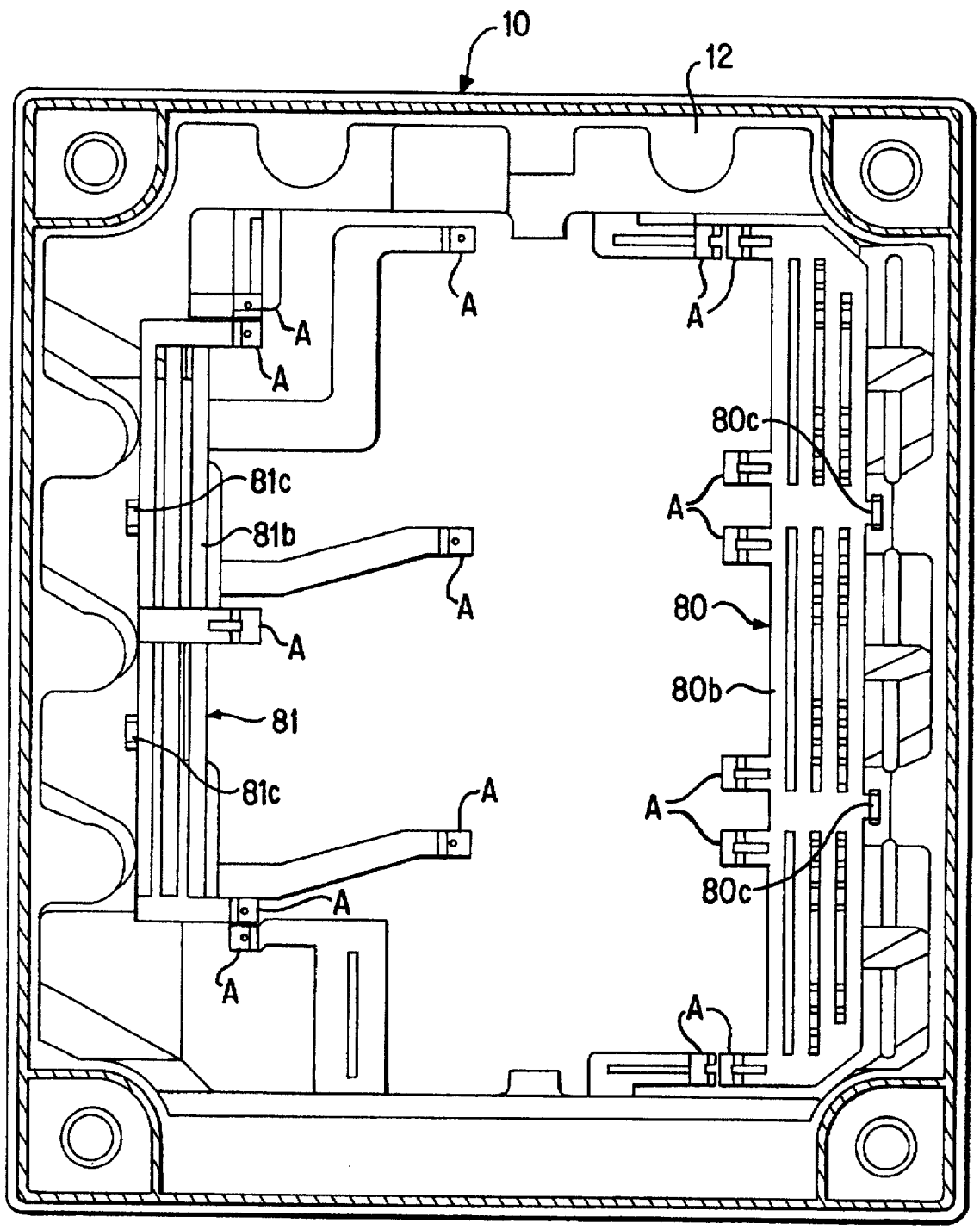
FIG. 2 is a bottom view of the insulative case frame of FIG. 1.
Figure 3A:
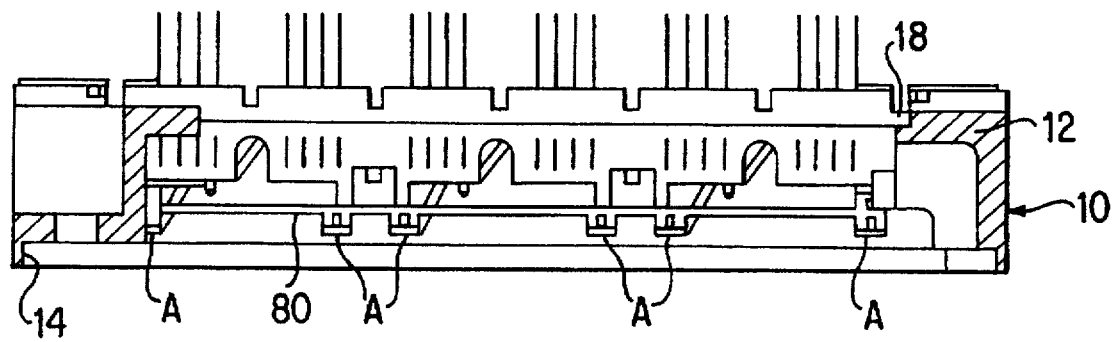
FIG. 3(a) is a cross sectional view taken along line 3(a)—3(a) of FIG. 1.
Figure 3B:
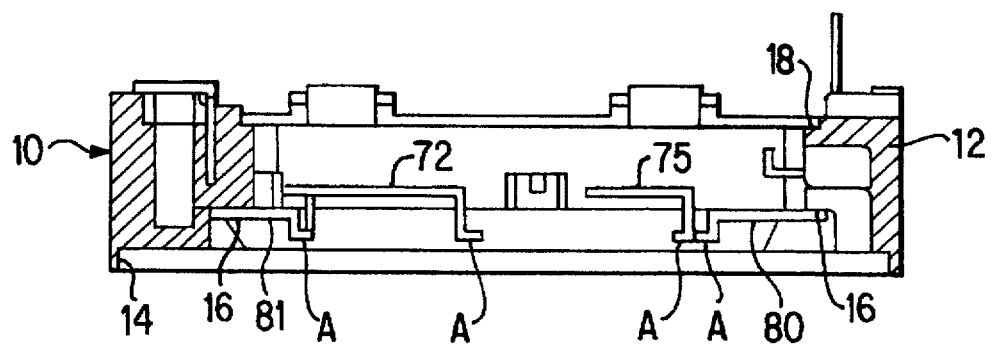
FIG. 3(b) is a cross sectional view taken along line 3(b)—3(b) of FIG. 1.

FIG. 1 is a top plan view, showing an insulative case frame having lead frames thereon, of an embodiment of a semiconductor device according to the present invention. FIG. 2 is a bottom view of the insulative case frame of FIG. 1. FIG. 3(a) is a cross sectional view taken along line 3(a)—3(a) of FIG. 1, and FIG. 3(b) is a cross sectional view taken along line 3(b)—3(b) of FIG. 1.

The semiconductor device of the invention is called "power module" or "intelligent power module". The semiconductor device has an insulative case frame 10 that has a frame portion 12. A radiator base plate (not shown) is bonded with an adhesive to a first opening step 14 formed on a first side of the frame portion 12 to close a first opening of the case frame 10. A circuit board (not shown) is bonded with a solder etc. to the inside face of the radiator base plate. Lead frames 70 through 76, 80 and 81 are connected at inner lead ends A thereof to a thick film wiring formed on the circuit board. The circuit board and inner leads in the lead frames are covered or immersed in a gel resin sealant or silicone resin 50 (not shown). An insulative cover plate (not shown) is bonded with an adhesive to a second opening step 18 formed on a second side of the frame portion 12 to close a second opening of the case frame 10.

As described earlier, semiconductor chips, such as power transistors, IGBTs (conductivity-modulation-type transistors), diodes, thyristors, etc. are mounted on the circuit board. Though not shown in the figure, the lead ends A of the lead frames 70 through 76, 80 and 81 are bonded with a solder etc. to the thick film wiring or land portion of the circuit board. The lead frames 70 through 76 for external connection are fixed to the frame portion 12 by insert molding, and terminal screws (not shown) for external connection are fixed to the frame portion 12 at respective terminal washers 70a through 76a.

Figure 4A:
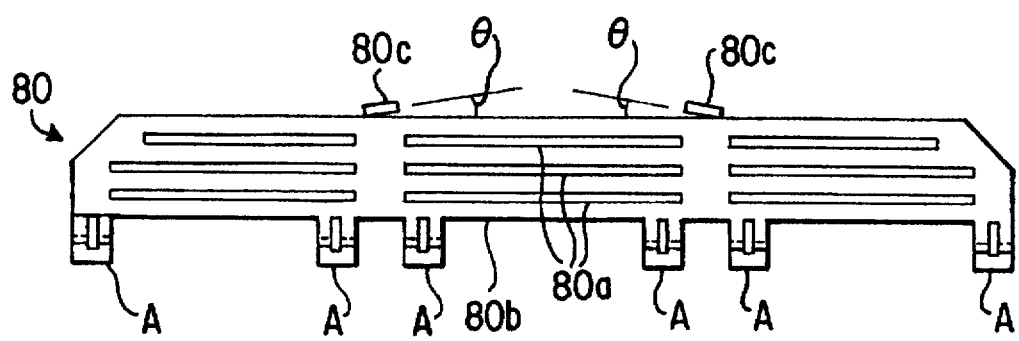
FIG. 4(a) is a top plan view of a lead frame of the invention.
Figure 4C:
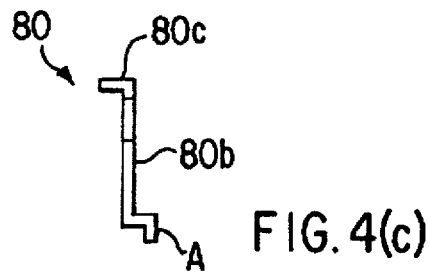
FIG. 4(c) is a side view of the lead frame of FIG. 4(a)
Figure 4B:
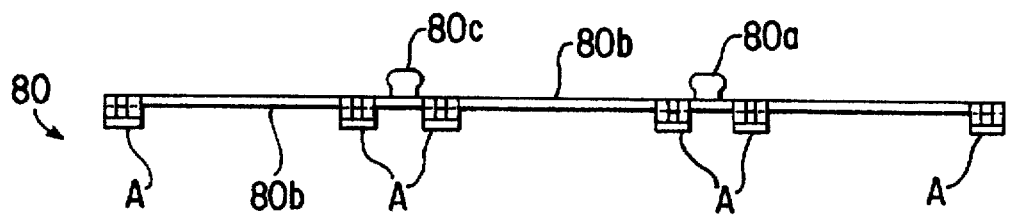
FIG. 4(b) is a front view of the lead frame of FIG. 4(a)
Figure 5A:
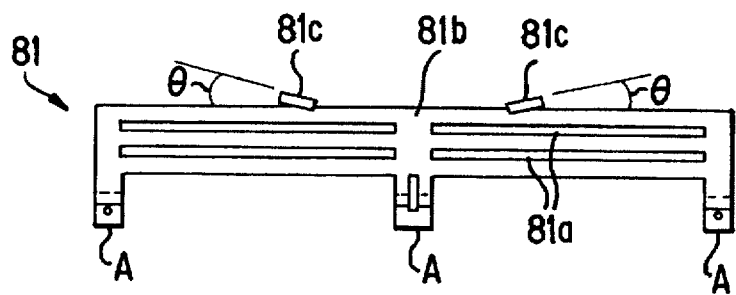
FIG. 5(a) is a top plan view of another lead frame of the invention.

FIG. 4(a) is a top plan view, FIG. 4(b) is a front view, and FIG. 4(c) is a side view of the lead frame 80. FIG. 5(a) is a top plan view, FIG. 5(b) is a front view, and FIG. 5(c) is a side view of the lead frame 81.

Figure 5C:
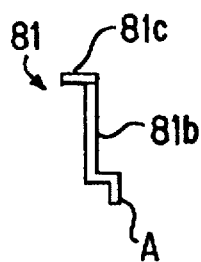
FIG. 5(c) is a side view of the lead frame of FIG. 5(a)
Figure 5B:
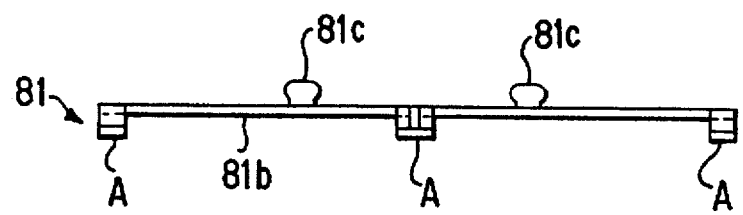
FIG. 5(b) is a front view of the lead frame of FIG. 5(a)

The lead frames 80, 81 for connecting a plurality of electrodes mutually on the circuit board for internal power supply are shaped as shown in FIGS. 4(a) through 4(c) and in FIGS. 5(a) through 5(c). Referring now to FIGS. 4(a) through 4(c), the lead frame 80 has a frame 80b on which is formed a plurality of slits 80a; lead ends A extending laterally and bent downward from a first long side of the frame 80b; and a pair of coupling protrusions 80c extending downward from a second long side of the frame 80b. The coupling protrusions 80c are twisted by a torsion angle e in the opposite directions from one another. The head of the coupling protrusion 80c is widened and shaped with an ellipse.

In the similar manner, as shown in FIGS. 5(a) through 5(c), a lead frame 81 has a frame 81b having a plurality of slits 81a; lead ends A extending sidewardly and bent downwardly from one side of the frame 81b; and a pair of coupling protrusions 81c extending downwardly from the other side of the frame 81b. The coupling protrusions 81c are twisted by a torsion angle θ in the opposite directions from one another. The head of the coupling protrusion 81c is widened and shaped with an ellipse.

Figure 6:
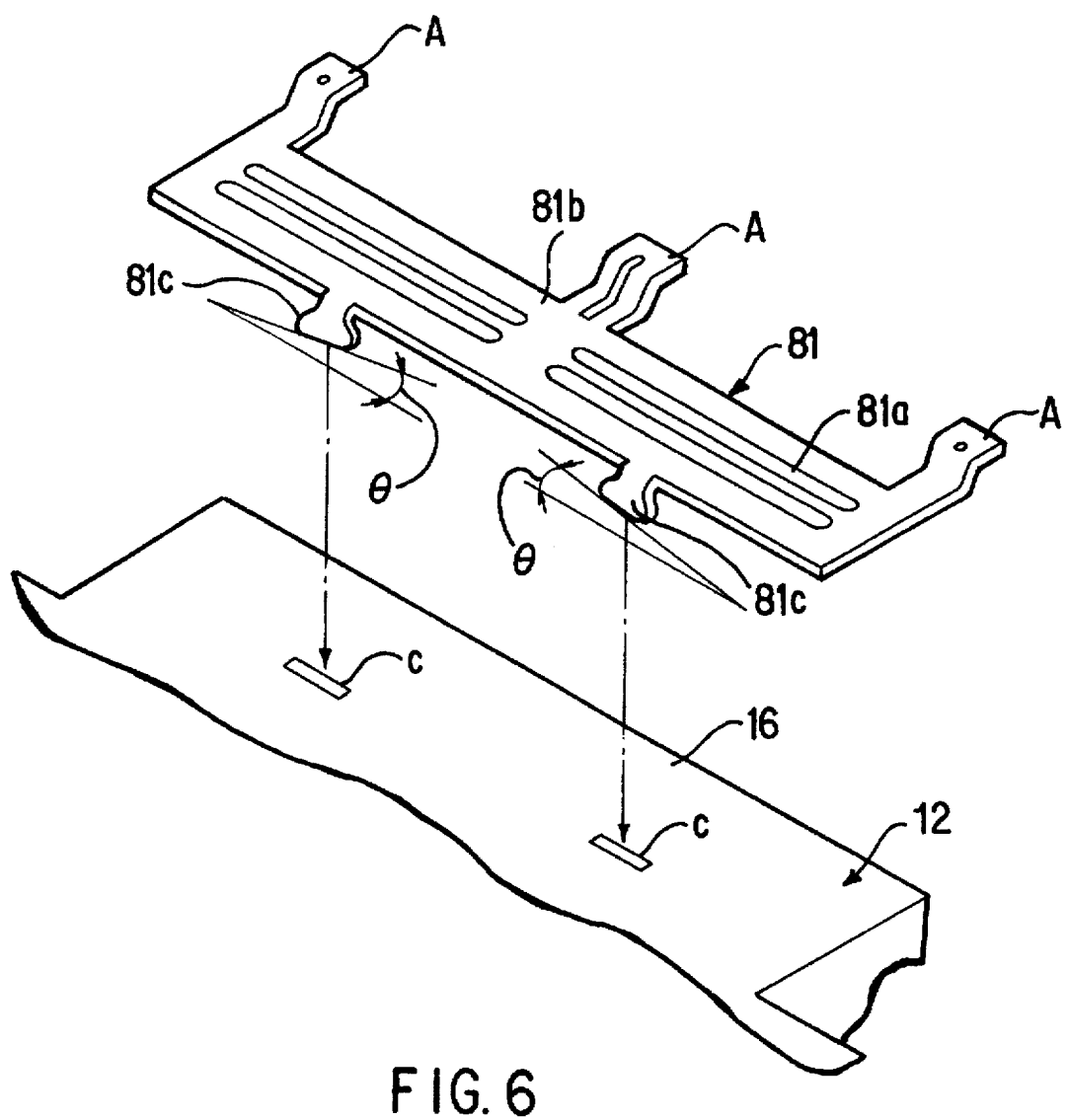
FIG. 6 is an exploded perspective view for showing the structure for the lead frame of the invention.

FIG. 6 is an exploded perspective view for showing the structure for the lead frame of the invention. As shown in the figure, the lead frame 81 is installed with the coupling protrusions 81c pressed into long coupling holes C formed on a third step 16 of the resin frame portion 12. The lead frame 80 is also installed in the similar manner.

Since the coupling protrusions 80c or 81c are twisted in opposite directions with a torsion angle θ, when the coupling protrusions 80c or 81c are inserted into the holes C, in an early stage of pressing the coupling protrusions 80c or 81c, the coupling protrusions 80c or 81c are turned in the opposite directions from one another. After complete insertion of the coupling protrusions 80c or 81c, the coupling protrusions are twisted in the directions which reduce the torsion angle, and the coupling protrusions 80c or 81c expand to be tightly coupled with the long coupling holes C by the elastic force of the restoring torsion. Thus, the coupling protrusions 80c or 81c pressed into the long coupling holes C do not rattle in the long coupling holes C. Since the elliptical head of the coupling protrusion 80c or 81c is smoothly inserted into the long coupling hole C, it is facilitated to press the coupling protrusions into the long coupling holes C.

Figure 7:
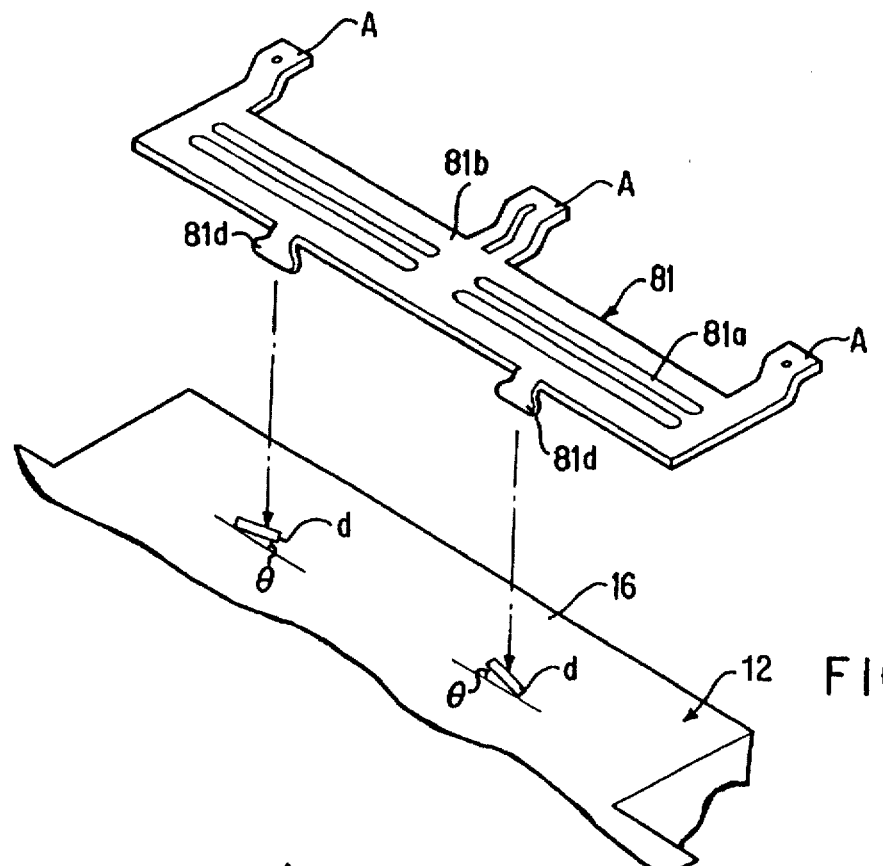
FIGS. 7 and 8 are exploded perspective views for showing different lead frames of the invention.
Figure 8:
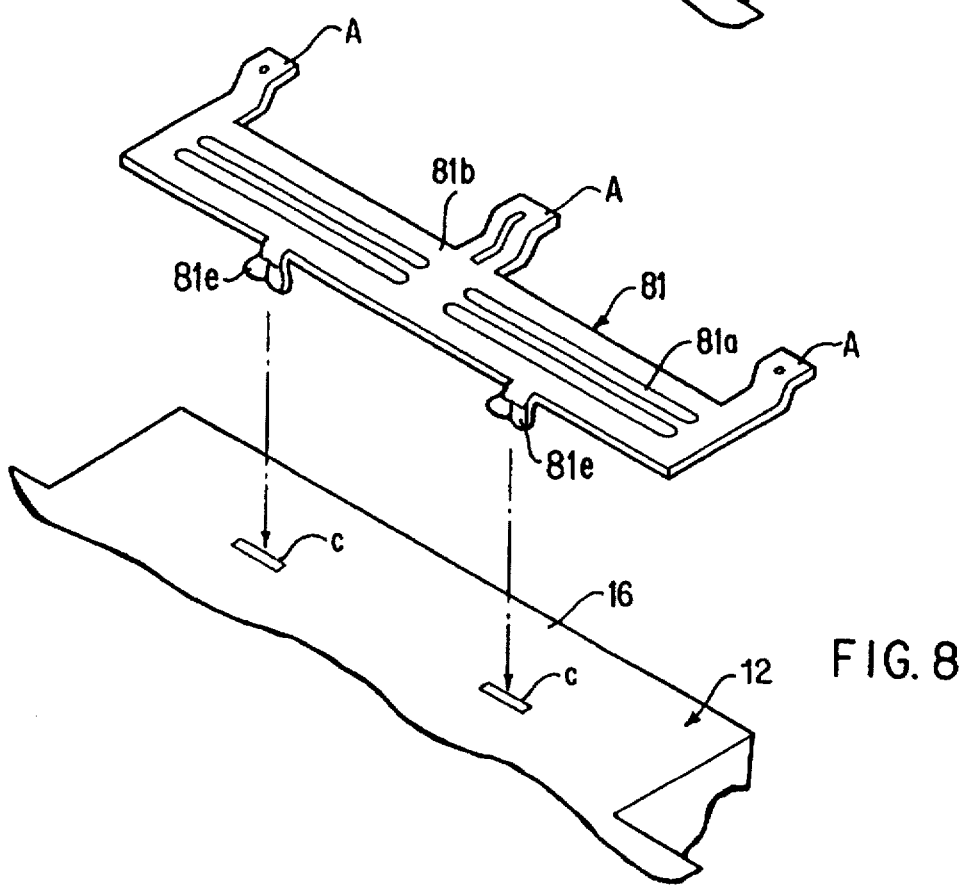
Figure 9:
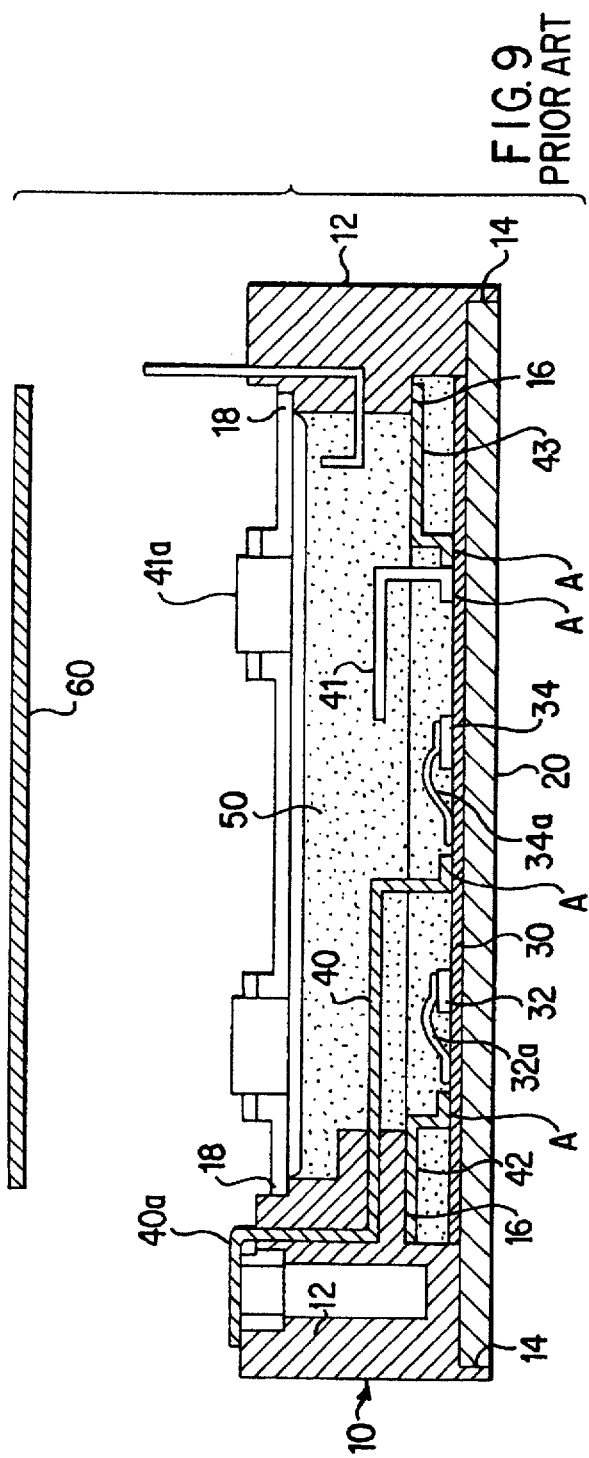
FIG. 9 is a cross sectional view for showing the conventional structure of a semiconductor device called a power module or an intelligent power module.

Though the adjacent coupling protrusions are twisted in the opposite directions from one another, the adjacent long coupling holes d may be formed in the twisted or inclined positions with respect to the untwisted or linear coupling protrusions, as shown in FIG. 7. Also, the coupling protrusion 81e may be bent in a V-shape along the longitudinal direction thereof, as shown in FIG. 8. Since the V-shape protrusion increases its opening angle in an early stage of pressing the coupling protrusions into the coupling holes, the coupling protrusion completely inserted into the coupling hole elastically restore its shape in the coupling holes. Therefore, the coupling protrusions are installed tightly in the holes formed on the insulative case frame without rattling.

As has been explained above, the semiconductor device of the invention utilizes the elastic restoring force to prevent the coupling protrusions from disengaging from the coupling holes. Therefore, the semiconductor device of the invention exhibits the following effects.

After the coupling protrusions are completely inserted in the respective coupling holes, the coupling protrusions expand or return by the elastic restoring torsional force in the coupling holes and coupled tightly with the insertion holes. Therefore, the lead frames are tightly mounted on the semiconductor device without rattling.

By shaping the head of each coupling protrusion with an ellipse, the elliptical head is inserted smoothly into the coupling hole. Therefore, it is facilitated to press the coupling protrusions into the coupling holes.

The V-shaped protrusions open the angles during the insertion into the coupling holes. After completely inserted into the coupling holes, the coupling protrusions return their shapes in the coupling holes by the elastic restoring force that decreases the angle of the V-shape. In this structure too, the lead frames are tightly mounted on the semiconductor device without rattling.

What is claimed is:

1. A semiconductor device comprising:

an insulative case frame including a frame portion having elongated coupling holes and first and second openings;

a radiator base plate covering the first opening of the insulative case frame;

a circuit board with semiconductor chips thereon, said circuit board being bonded to the radiator base plate;

a resin sealant filled in an inner space of the case frame, said resin sealant covering the circuit board;

an insulative cover plate closing the second opening of the insulative case frame; and at least one lead frame having elastic coupling protrusions and inner leads, said elastic coupling protrusions being elastically retained in the elongated coupling holes to securely connect the lead frame to the case frame, one elastic coupling protrusion and one elongated coupling hole which engage together being inclined relative to each other to have a torsion angle in a direction of inserting the coupling protrusion to the coupling hole, said elastic coupling protrusions situated adjacent to each other in the at least one lead frame being inclined in directions opposite to each other and inclined relative to the elongated holes to thereby elastically engage the coupling protrusion and the elongated hole.

2. A semiconductor device according to claim 1, wherein each coupling protrusion has a head with an elliptical shape.

3. A semiconductor device according to claim 1, wherein said at least one lead frame further includes a frame portion, said elastic coupling protrusions projecting substantially perpendicularly to the frame portion and being inclined relative one side of the frame portion.

4. A semiconductor device comprising:

an insulative case frame including a frame portion having elongated coupling holes and first and second openings;

a radiator base plate covering the first opening of the insulative case frame;

a circuit board with semiconductor chips thereon, said circuit board being bonded to the radiator base plate;

a resin sealant filled in an inner space of the case frame, said resin sealant covering the circuit board;

an insulative cover plate closing the second opening of the insulative case frame; and at least one lead frame having elastic coupling protrusions and inner leads, said elastic coupling protrusions being elastically retained in the elongated coupling holes to securely connect the lead frame to the case frame, one elastic coupling protrusion and one elongated coupling hole which engage together being inclined relative to each other to have a torsion angle in a direction of inserting the coupling protrusion to the coupling hole, said elongated coupling holes situated adjacent to each other in the case frame and to be connected to the coupling protrusions being inclined in directions opposite to each other and inclined relative to the coupling protrusions to thereby elastically engage the coupling protrusions and the elongated holes.

5. A semiconductor device according to claim 4, wherein said at least one lead frame further includes a frame portion, said elastic coupling protrusions projecting substantially perpendicularly to the frame portion and extending along one side of the frame portion, said coupling holes being inclined relative to the one side of the frame portion.

* * * * *

UNITED STATES PATENT AND TRADEMARK OFFICE
CERTIFICATE OF CORRECTION

Figure 10:
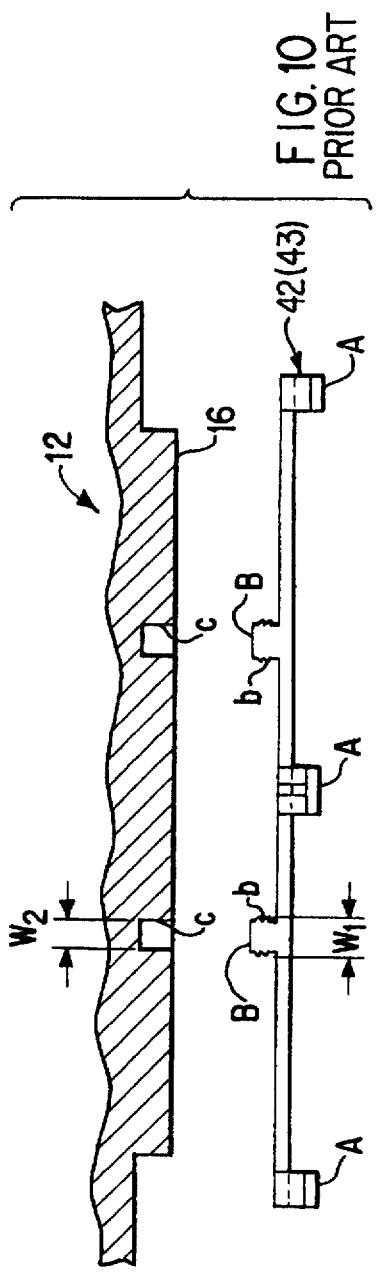
FIG. 10 is a cross section view for showing the installation of the lead frames of the semiconductor device of FIG. 9.

PATENT NO. : 5,691,884
DATED : Nov. 25, 1997
INVENTOR(S) : Shin Soyano, Susumu Toba It is certified that error appears in the above-indentified patent and that said Letters Patent is hereby corrected as shown below:

In column 1, line 45, change "FIG. 8" to --FIG. 10--; and

In column 4, line 14, change "e" to --$\theta$--.

Signed and Sealed this

Twelfth Day of January, 1999

Attest:

Attesting Officer

*Acting Commissioner of Patents and Trademarks*